Nov. 27, 1962 L. E. DONNELL ET AL 3,065,524

METHOD OF INTERCONNECTING ELECTRICAL APPARATUS

Filed Aug. 31, 1959

INVENTORS
LAWRENCE E. DONNELL
and LESTER Q. KRASIN
BY
R. O. Covell
ATTORNEY 3,065,524

METHOD OF INTERCONNECTING ELECTRICAL APPARATUS

Lawrence E. Donnell, Melrose, Mass., and Lester Q. Krasin, Amarillo, Tex.; said Krasin assignor, by mesne assignments, to Lenkurt Electric Co., Inc., San Carlos, Calif., a corporation of Delaware Filed Aug. 31, 1959, Ser. No. 337,042
3 Claims. (Cl. 29—155.5)

This invention relates to the manufacture of electrical circuit equipment and particularly to methods and means for mounting and electrically interconnecting apparatus components to form circuit equipment assembly units.

Objects of the invention are to facilitate the mounting and electrical interconnection of apparatus components on an assembly board, to minimize and simplify the operations involved and the devices employed in positioning and electrically interconnecting the components to form an operative circuit assembly unit, and to improve the means and methods of assembling and electrically interconnecting components to attain the advantages of printed wiring techniques without using printed wiring, thereby to avoid well-known shortcomings of so-called printed circuits.

The invention is a method of mounting and electrically interconnecting circuit components to form a circuit equipment assembly unit comprising the riveting of metallic eyelets in required positions on an assembly board; the positioning of each circuit component on the assembly board and insertion of the terminal wires of each component into the required eyelets; the squeezing of each eyelet to secure the end of the terminal wire inserted therein; the winding of a piece of bare tinned wire around the squeezed portion of each eyelet in succession in each group of eyelets, the interconnection of which is required; the simultaneous dipping of the wired ends of all eyelets in a liquid fluxing agent; and the simultaneous dipping of the wired ends of all eyelets into hot liquid solder for a time only long enough to securely solder each eyelet to the interconnecting wire wound thereon and to the associated component terminal wire inserted and squeezed therein.

A feature of the invention is the use of a metallic eyelet having an extruded annular shoulder or beading midway between the ends to facilitate and simplify insertion of an eyelet from a hopper in each hole in the mounting board with the beading of each eyelet engaging the same side of the board. Another feature is the presentation of each inserted eyelet to a riveting mandrel to effect expansion of the end of the eyelet to secure the eyelet on the board, the expanded end being in engagement with one surface of the board and the annular shoulder in engagement with the opposite surface of the board. A further related feature is the forming of the expanded end of the eyelet into a cup shape, thus to constitute a receptacle for retaining any flux which may rise in the eyelet when the other end of the eyelet is dipped in hot liquid solder, whereby spurious electrical connections or leakage paths, resulting from deterioration of the insulating quality of spilled flux, are prevented.

Another feature of the invention is the notching and expanding of the other end of each eyelet, while the one end is being expanded to rivet the eyelet on the assembly board, to form small projections or lugs for preventing the interconnecting wire, thereafter wound thereon, from slipping off the eyelet during subsequent handling prior to being soldered thereto.

Another feature of the invention is the squeezing of each eyelet between the annular shoulder and the notched end, after insertion of the associated component terminal wire or wires therein, thus to secure the components in desired position on the board prior to soldering of the eyelets to the terminal wires.

Further features of the invention, resulting from the use of and form of the eyelets is the simultaneous application of liquid flux to all of the eyelets riveted on the assembly board without the flux coming into contact with the board, thus preventing the formation of electrical leakage paths through flux attached to the surface of the board; and the simultaneous application of hot liquid solder to the eyelets, without the hot solder coming into contact with the assembly board, preventing warping or blistering of the assembly board.

A further feature of the invention is the evaporation of all flux solvent from the eyelets and interconnecting wire by application of heat thereto before being dipped in the hot solder, so as to assure complete and effective soldering.

Another feature of the invention, resulting from the use of and the form of the eyelets is facilitation of the replacement of a defective component merely by cutting off the terminal wires at the adjacent ends of the associated eyelets and the insertion and soldering of the terminal wires of the replacing component in the cup-shaped ends of these eyelets.

These and other features of the invention may be better understood from the following description taken in conjunction with the accompanying drawings.

Referring to the drawings.

Figure 1:
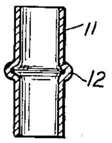
FIG. 1 is a sectional view of a metallic eyelet adapted for use in the manufacture of an electrical circuit assembly unit in accordance with the invention.
Figure 2:
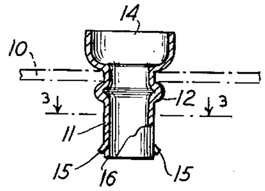
FIG. 2 shows a portion of an assembly board with a partial cross-sectional view of an eyelet riveted on the board.
Figure 3:
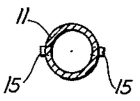
FIG. 3 shows a cross-section of the riveted eyelet taken on line 3—3 of FIG. 2.

An electrical circuit assembly board comprising a sheet of plastic or other suitable insulating material, of desired size and shape, is provided for mounting circuit components. Holes are punched in the board in desired positions for the insertion of metallic eyelets therein for riveting to the board. The eyelets may be made of copper or soft brass or other suitable metal. Eyelets of the shape shown in FIG. 1 are particularly adapted for this use, the extruded annular shoulder or beading 12 on the eyelet 11 being positioned midway between its ends to facilitate insertion of an eyelet out of a hopper in each hole in a mounting board with the shoulder 12 in engagement with one surface of the mounting board 10 as shown in FIG. 2. After insertion, each eyelet 11 is presented to a riveting mandrel to effect a cup-shaped expansion of the end inserted through the hole whereby the eyelet is fixed to the board 11 with the expanded end 14 engaging the surface of the board opposite the surface engaged by the annular shoulder 12. Coincident with the expansion of one end to rivet the eyelet on the board, the other end of the eyelet is notched to form two small projecting lugs 15, spaced 180° apart. These notches and projections 15, which are shown as formed in FIGS.

2 and 3, are provided for retaining the interconnecting wire wound thereon, prior to soldering, as hereinafter further explained.

Figure 4:
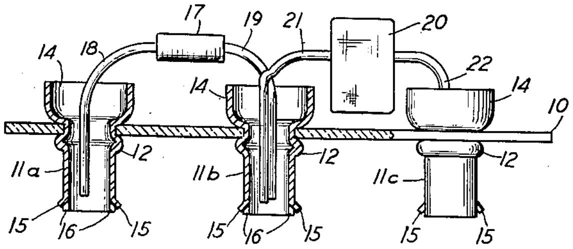
FIG. 4 shows a portion of an assembly board with two components positioned thereon with their terminal wires inserted in associated eyelets riveted on the board.

After all of the eyelets have been inserted and riveted on the assembly board, the various electrical components of the circuit assembly unit are positioned on the board with the terminal wires of each component inserted in the cup-shaped ends of the eyelets, the wires extending through to the other end of eyelets. In FIG. 4, three eyelets 11*a*, 11*b*, and 11*c* are shown, riveted to an assembly board 10; two components, a resistor 17 and a capacitor 20, are positioned on the board, the terminal wires 18 and 19 of resistor 17 extending into the cup-shaped ends 14 of the eyelets 11*a* and 11*b* and the terminal wires 21 and 22 of capacitor 20 extending into the cup-shaped ends of eyelets 11*b* and 11*c*.

Figure 5:
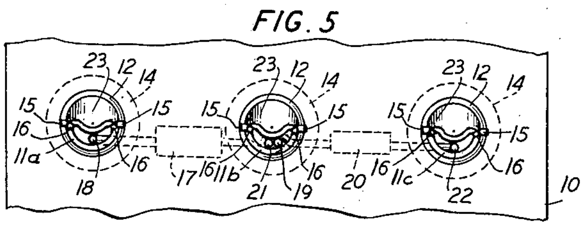
FIGS. 5 and 8 show a bottom view of the portion of the assembly board and end views of the squeezed ends of the eyelets shown in FIG. 4.
Figure 8:
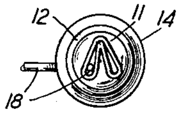

After positioning of the components and insertion of the terminal wires, the notched ends of the eyelets are squeezed to secure the component terminal wires therein, the squeezed ends 23 being illustrated in FIG. 5. The terminal wire 18 of resistor 17 is squeezed in the end 23 of eyelet 11*a*, the terminal wires 19 of resistor 17 and terminal wire 21 of capacitor 20 are squeezed in the end 23 of eyelet 11*b*, and the terminal wire 22 of capacitor 20 is squeezed in the end 23 of eyelet 11*c*. The squeezing extends from the notched end of each eyelet to a point somewhat over half of the distance to the annular shoulder and may vary in form from that at the notched end as shown in FIG. 5. All of the eyelets in a row may be squeezed simultaneously, by a squeezing mechanism, whereby the pattern of the squeezed ends 23 is identical. Alternatively, each eyelet may be squeezed individually, in which case the pattern of the ends may vary slightly. In either case, the squeezing of the component terminal wires in the notched ends of the eyelets holds the wires and components in position prior to being permanently fastened by the soldering of the eyelets, as hereinafter mentioned. It is to be noted that the squeezing should secure the smallest terminal wire which may be inserted in an eyelet without danger of fracturing the eyelet or wire; and the squeezing should not entirely close the end of the eyelet so that, when the eyelets are successively dipped in liquid flux and hot solder (as hereinafter described) both flux and solder enter the eyelet. If the terminal wires are not secured rigidly by the squeezing, vibration of the components, while the solder is freezing, could cause a connection which is, or may become, unsatisfactory. FIG. 8 shows a preferred form of the end of an eyelet after squeezing, there being two loop-shaped openings into which flux and solder may enter, the maximum width of each opening being smaller than the smallest wire to be held by the eyelet. Such a form may be affected by a squeezing fixture, the male jaw of which has a smaller taper (lesser included angle) than the opposing female jaw.

Figure 6:
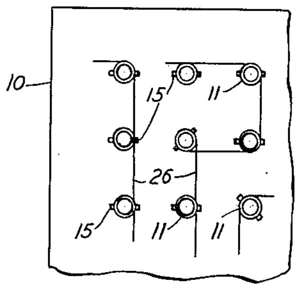
FIG. 6 shows a portion of an assembly board with interconnecting wire wound on the ends of the eyelets.

After mounting all components and squeezing the eyelets and terminal wires, the eyelets are electrically interconnected by winding bare, tinned copper wire around the squeezed end of each eyelet in succession. Separate pieces of wire may be used to interconnect all of the eyelets in each group, the electrical interconnection of which is required to form the circuit connections to constitute an operative circuit assembly. Alternatively, a continuous wire may be wound around all of the eyelets in succession, in which case the sections of wire between eyelets which are not to be electrically connected, will be cut off after the soldering of the eyelets and wiring is completed. One turn of interconnecting wire around each eyelet is sufficient, the projecting lugs 15 being effective to prevent the wire from slipping off during handling, prior to soldering. FIG. 6 illustrates an assembly board 10 with three groups of interconnected eyelets. While not so shown in FIG. 6, the wired and squeezed ends of the eyelets are irregular in form, for instance, as shown in FIG. 5, with at least one of the two projecting lugs 15 effective to retain the wire on each eyelet.

Figure 7:
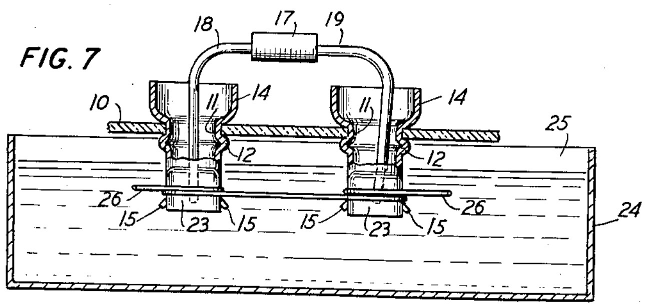
FIG. 7 shows a portion of an assembly board including one component and two associated eyelets with their squeezed and wired ends submerged in liquid flux in a tank 24.

After all interconnections have been made, the assembly board is held over a tank of resin or other suitable liquid fluxing agent and lowered until the wired ends of all eyelets are simultaneously dipped in the flux but with a space remaining between the surface of the flux and the annular shoulders of the eyelets so that the flux does not come in contact with the under surface of the assembly board. FIG. 7 illustrates an assembly board 10 with the wired ends of two eyelets 11 dipped in liquid flux 25 in the tank 24, and with a space remaining between the surface of the flux 25 and the mounting board 10 so that no flux can adhere to the board. After the wired ends of the eyelets have been dipped in liquid flux, the assembly board is placed in an oven to evaporate all flux solvent to assure complete and effective soldering when dipped in hot solder. The evaporation may be effected by any other suitable method.

After evaporation of the flux solvent, the assembly boards are placed in suitable fixtures which are lowered to simultaneously dip the wired ends of all eyelets into hot solder for a time only long enough to completely solder the wired end of each eyelet to the interconnecting wire wound thereon and to the terminal wire or wires inserted therein. FIG. 7 is illustrative of the soldering except that the liquid in tank 24 is hot solder instead of liquid flux. A space is maintained between the surface of the solder and the eyelet shoulders so that no solder comes in contact with the under surface of the assembly board. This space together with timing of the dipping in the solder prevents blistering or warping of the board. During soldering, excess flux may rise in the eyelets but the cup-shaped end retains any such flux and prevents flux from spilling onto the assembly board, thus preventing the formation of spurious connections or other leakage connections through any such flux from change in humidity or lapse of time.

The interconnections made by the described means and methods with the usual bare tinned copper wire is much stronger than the interconnections of printed circuits left after etching, with no possibility of corrosion from residual etchants as in the case of printed circuits.

It may also be noted that the expanded end of the eyelets on the component side of the assembly board facilitates the replacement of defective components. The defective component is placed on the board with the terminal wires inserted and soldered into the expanded end of the eyelet, the expanded end being deep enough to provide a satisfactory soldered connection.

The invention is not limited to the particular means and methods described above and illustrated in the drawings but includes various changes and equivalents, not described or illustrated, within the scope of the invention as claimed.

What is claimed is:

1. A method of mounting and interconnecting electrical components comprising the insertion of copper eyelets in holes through a plastic assembly board, the eyelets being tubular with an extruded annular shoulder or beading engaging one side of the board; presentation of each eyelet, after insertion, to a riveting mandrel to effect expansion of the end inserted through the board into cup-shaped form to engage the surface of the board opposite the surface engaged by the eyelet shoulder thereby to secure the eyelet on the board in required position for use in mounting and interconnecting electrical circuit components to form a desired circuit assembly unit, and to also effect the expansion and notching of the other end of the eyelet to form projecting lugs to facilitate wiring of the eyelets; positioning the electrical components on the assembly board with the terminal wires of each component inserted in the cup-shaped ends of associated eyelets and extending therethrough; squeezing the expanded and notched end of each eyelet to secure the associated component terminal wire or wires therein and hold the associated components in desired position; winding a piece of bare tinned copper wire around the squeezed end of each eyelet in each group of eyelets requiring electrical interconnection, one turn of the wire around each of the eyelets in the group, the projecting lugs formed at the notched ends of the eyelets preventing the wire from slipping off the eyelets before being soldered; holding the assembly board, after wiring is completed, over a tank of resin or other suitable liquid flux and lowering the board so that the notched and wired ends of the eyelets are simultaneously dipped into the flux without the flux coming into contact with the under surface of the board; and lowering the board into a solder pot so that the notched and wired ends of said eyelets are simultaneously covered with hot liquid solder for a time only sufficient to securely solder each eyelet to the wire wound thereon and to the component wire or wires inserted therein without the hot solder coming into contact with the assembly board, so as to prevent blistering or warping of the board, the cup-shaped ends of said eyelets being effective to retain any excess flux which may rise in the eyelets during application of the hot solder and prevent any such flux from spilling on the board, thereby eliminating the possibility of spurious interconnection of components or other current leakage caused by deterioration of the insulating quality of such flux due to change in humidity or lapse of time.

2. A method of mounting and interconnecting electrical circuit components according to claim 1, further comprising the application of heat to the eyelets and interconnecting wire after being dipped in liquid flux so as to evaporate all flux solvent therefrom before being dipped in hot solder and thereby assure complete and effective soldering.

3. A method of mounting electrical circuit components on an assembly board and interconnecting said components electrically to form a circuit equipment assembly unit comprising the insertion of copper eyelets from a hopper into a plurality of holes in required positions of a plastic assembly board, one in each hole, each eyelet having an annular shoulder or beading midway between its ends for engagement with one side of the board; expanding the end of each eyelet on the other side of the board into cup-shaped form, by presentation to a riveting mandrel, to engage with said other side of the board and thereby to securely fix the eyelet on the board; notching and expanding the opposite end of each eyelet, by presentation to said riveting mandrel, to form a projecting lug for retaining wire wound thereon; the positioning of each of a plurality of electrical components on said one side of the board and insertion of the terminal wires of each said component in the desired eyelets and therethrough to the notched ends; squeezing each eyelet between the annular shoulder and the notched end after insertion of the component terminal wire or wires therein to secure the wire or wires and thus fix the components in required position on the board; winding bare tinned copper wire around the squeezed portion of each eyelet in succession of each group of eyelets requiring interconnection, the lugs projecting out from the expanded and notched ends of such eyelets preventing the wire from slipping off prior to being soldered; the simultaneous dipping of the notched ends of said eyelets into liquid flux, without the flux coming into contact with the assembly board; and the simultaneous dipping of the notched ends of said eyelets and the interconnecting wire wound thereon into hot liquid solder only for a long enough time to securely solder the eyelets to the interconnecting wires wound thereon and to the component terminal wires extending therethrough, the cup-shaped expanded end of each of said eyelets constituting a receptacle for retaining any flux which may rise therein during the dipping of the notched ends in hot solder, thereby preventing the spilling of flux onto the top surface of the board and the forming of any current leakage path.

References Cited in the file of this patent

UNITED STATES PATENTS

| | | |
|---|---|---|
| 2,533,483 | Losquadro | Dec. 12, 1950 |
| 2,555,075 | Bergan | May 29, 1951 |
| 2,651,833 | Kernahan | Sept. 15, 1953 |
| 2,671,264 | Pessel | Mar. 9, 1954 |
| 2,673,336 | Peters | Mar. 23, 1954 |
| 2,848,792 | Reitz | Aug. 26, 1958 |
| 2,871,548 | Pisani | Feb. 3, 1959 |
| 2,903,627 | McGarvey | Sept. 8, 1959 |
| 2,909,710 | Platt | Oct. 20, 1959 |
| 2,909,758 | Modrey | Oct. 20, 1959 |
| 2,915,678 | Frazier et al. | Dec. 1, 1959 |

FOREIGN PATENTS

| | | |
|---|---|---|
| 210,916 | Australia | June 21, 1956 |